United States Patent [19]
Joo et al.

[11] Patent Number: 6,124,203
[45] Date of Patent: Sep. 26, 2000

[54] METHOD FOR FORMING CONFORMAL BARRIER LAYERS

[75] Inventors: Young-Chang Joo, Sunnyvale; Dirk Brown, Santa Clara; Simon S. Chan, Saratoga, all of Calif.

[73] Assignee: Advanced Micro Devices, Inc., Sunnyvale, Calif.

[21] Appl. No.: 09/206,669

[22] Filed: Dec. 7, 1998

[51] Int. Cl.$^7$ .................................................. H01L 21/283

[52] U.S. Cl. ........................... 438/653; 438/654; 438/656; 438/672

[58] Field of Search .................................... 438/653, 654, 438/656, 672

[56] References Cited

U.S. PATENT DOCUMENTS 5,861,344  1/1999  Roberts et al. .
5,963,832  10/1999  Srinivasan et al. .

FOREIGN PATENT DOCUMENTS 60-124841  7/1985  Japan .
62-147743  7/1987  Japan .

*Primary Examiner*—George Fourson
*Assistant Examiner*—Joannie A Garcia
*Attorney, Agent, or Firm*—Mikio Ishimaru

[57] ABSTRACT

The present invention provides a method for forming barrier layers in a channel or via opening by using a plasma etching technique to etch back the barrier layer which reduces the electrical resistance of the barrier layer, maintains its barrier effectiveness and enhances the subsequent filling of the channel or via opening by conductive materials.

20 Claims, 2 Drawing Sheets

METHOD FOR FORMING CONFORMAL BARRIER LAYERS

TECHNICAL FIELD

The present invention relates generally to semiconductors and more specifically to barrier materials used in semiconductor processing.

BACKGROUND ART

In the process of manufacturing integrated circuits, after the individual devices, such as the transistors, have been fabricated in the silicon substrate, they must be connected together to perform the desired circuit functions. This connection process is generally called metallization, and is performed using a number of different photolithographic and deposition techniques.

One metallization process, which is called the "damascene" technique, starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and an optional thin adhesion layer may be deposited to coat the walls of the first channel opening to ensure good adhesion and electrical contact of subsequent layers to the underlying semiconductor devices. A barrier layer is then deposited on the adhesion layer to prevent diffusion of subsequently deposited conductive material into the oxide layer and the semiconductor devices (the combination of adhesion and barrier material is collectively referred to as "barrier layer" herein). It should be noted that some barrier materials also have good adhesion which is why the adhesion layer is optional. A first conductive material is then deposited and subjected to a chemical-mechanical polishing process which removes the first conductive material above the first channel oxide layer and damascenes the first conductive material in the first channel openings to form the first channels.

For multiple layers of channels, another metallization process, which is called the "dual damascene" technique is used in which the channels and vias are formed at the same time. In one example, the via formation step of the dual damascene technique starts with the deposition of a thin stop nitride layer over the first channels and the first channel oxide layer. Subsequently, a separating oxide layer is deposited on the stop nitride layer. This is followed by deposition of a thin via nitride layer. Then a via step photoresist is used in a photolithographic process to designate round via areas over the first channels.

A nitride etch is then used to etch out the round via areas in the via nitride layer. The via step photoresist is then removed, or stripped. A second channel dielectric layer, which is typically an oxide layer, is then deposited over the via nitride layer and the exposed oxide in the via area of the via nitride layer. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. An adhesion layer is then deposited to coat the via openings and the second channel openings. Next, a barrier layer is deposited on the adhesion layer. This is followed by a deposition of the second conductive material in the second channel openings and the via openings to form the second channel and the via A second chemical mechanical polishing process leaves the two vertically separated, horizontally perpendicular channels connected by a cylindrical via.

The use of the damascene techniques eliminates metal etch and dielectric gap fill steps typically used in the metallization process. The elimination of metal etch steps is important as the semiconductor industry moves from aluminum to other metallization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), or titanium nitride (TiN) are used as barrier materials for copper. A thin adhesion layer formed of an adhesion material, such as titanium, is first deposited on the dielectrics or vias to ensure good adhesion and good electrical contact of the subsequently deposited barrier layers to underlying doped regions and/or conductive channels. The barrier layer stacks formed of adhesion/barrier materials such as tantalum/tantalum nitride (Ta/TaN) and titanium/titanium nitride (Ti/TiN) have been found to be useful as adhesion/barrier material combination for copper interconnects.

The "barrier effectiveness" of a barrier layer with respect to a conductive material is its ability to prevent diffusion of the conductive material. The barrier effectiveness of a barrier layer is determined in part by its thickness, including the thickness uniformity, and its quality, including the number and sizes of defects such as pinholes which form on deposition. To resist copper diffusion, it is found that a minimum barrier layer thickness of 5 nm is required. However, to minimize the electrical resistance due to the barrier layer, it is desirable to maintain a thin barrier layer. Therefore, it is desirable to keep the barrier layer thickness close to about 5 nm.

Barrier layers for copper interconnect in a damascene process are typically deposited by physical vapor deposition (PVD) or derivatives of PVD techniques. The common problems associated with most of these deposition techniques are poor sidewall step coverage and conformality, i.e., the barrier layer thickness is much higher in wide-open areas, such as on top of the channel oxide layer and in the upper portion of the sidewalls of the channels and vias than in the lower portion of the sidewalls of the channels and vias. To guarantee a minimum barrier layer thickness of 5 nm anywhere in the channel or via openings, including at the lower portion of the sidewalls, the barrier layer thickness in wide-open areas tends to be much higher than 5 nm. This increase in barrier layer thickness in the wide-open areas undesirably increases the electrical resistance of the barrier layer. Further, as the width of the channels and vias have decreased in size due to the size reduction in the semiconductor devices, an excessively thick barrier layer in the wide-open areas interferes with the subsequent filling of the channel and via openings with conductive materials.

A solution, which would form barrier layers in channel or via openings and result in a reduction in the electrical resistance of the barrier layers without a decrease in its barrier effectiveness and an improvement in the subsequent filling of the channel or via openings by conductive materials, has long been sought, but has eluded those skilled in the art. As the semiconductor industry is moving from aluminum to copper and other type of materials with greater electrical conductivity and diffusiveness through dielectrics, it is becoming more pressing that a solution be found.

DISCLOSURE OF THE INVENTION

The present invention provides a method for forming barrier layers in channel or via openings with reduced electrical resistance.

The present invention further provides a method for forming barrier layers in channel or via openings with improved step coverage and conformality.

The present invention provides a method for forming barrier layers in channel or via openings that enhances the subsequent filling of the channel or via openings with conductive materials.

The present invention still further provides a method for forming barrier layers in channel or via openings by using a plasma etching technique to etch back the barrier layers which results in barrier layers with reduced electrical resistance while maintaining its barrier effectiveness and enhancing the subsequent filling of the channel or via openings by conductive materials.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
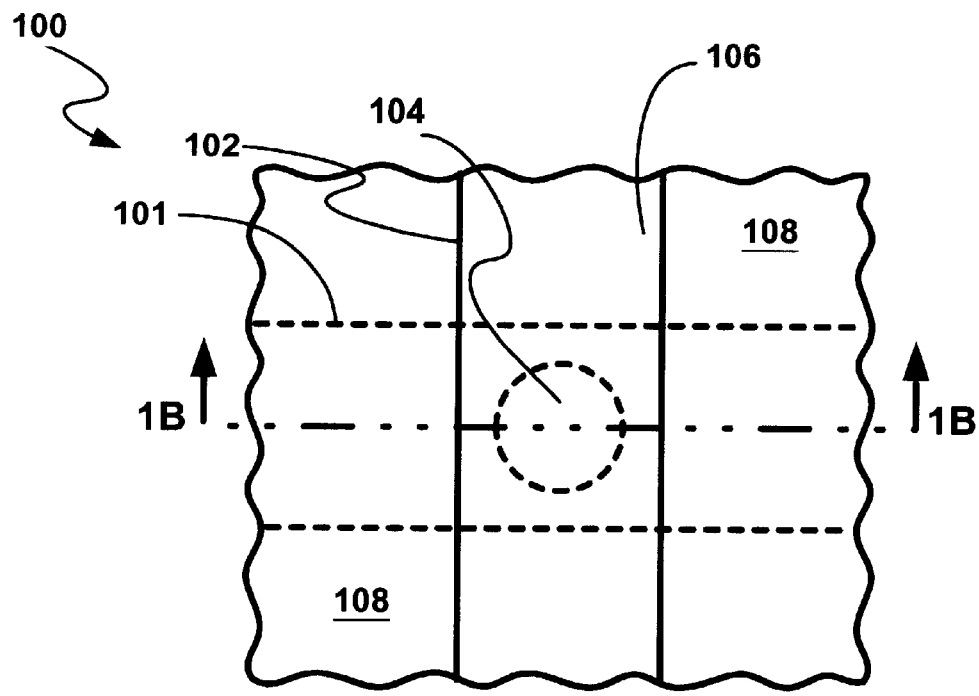
FIG. 1A (PRIOR ART) is a plan view of aligned channels with a prior art via.

Referring now to FIG. 1A (PRIOR ART), therein is shown a plan view of a prior art pair of aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel comprises a first conductive material. The second channel 102 is formed by filling a second channel opening 106 disposed in a second channel oxide layer 108 with a second conductive material. The second channel opening 106 is defined by walls (sidewalls) 109 of second oxide layer 108.

Figure 1B:
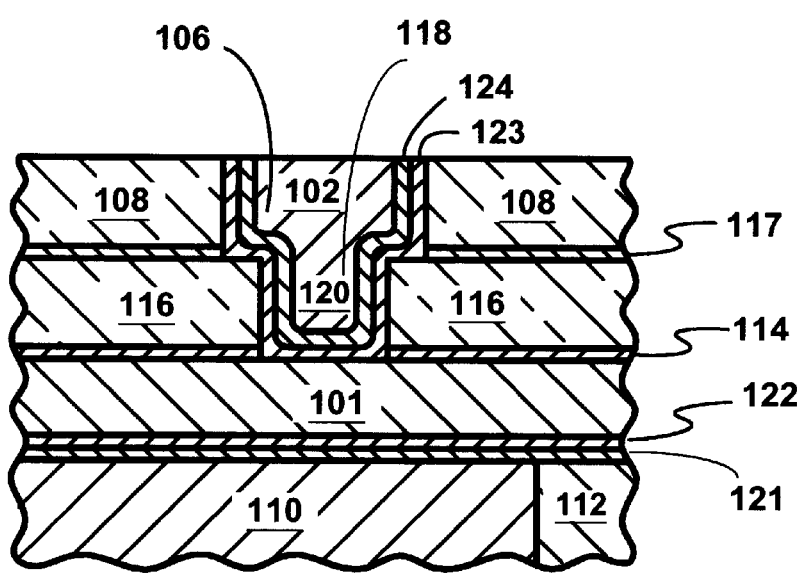
FIG. 1B (PRIOR ART) is a cross-section of FIG. 1A (PRIOR ART) along line 1B—1B.

Referring now to FIG. 1B (PRIOR ART), therein is shown a cross-section of FIG. 1A (PRIOR ART) along 1B—1B. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via 104 of FIG. 1A (PRIOR ART) defines a cylindrical via 120 when it is filled with the second conductive material.

Also shown disposed around the first channel 101 are a barrier layer 121 and a seed layer 122, and around the second channel 102 and the cylindrical via 120 are a barrier layer 123 and seed layer 124. Barrier layers include barrier materials and, where necessary, are used to prevent diffusion of the conductive materials into the adjacent areas of the semiconductor. Tantalum is an example of a good barrier material with good adhesion characteristics. Titanium nitride and tantalum nitride are other examples of barrier materials for copper channels.

Figure 1C:
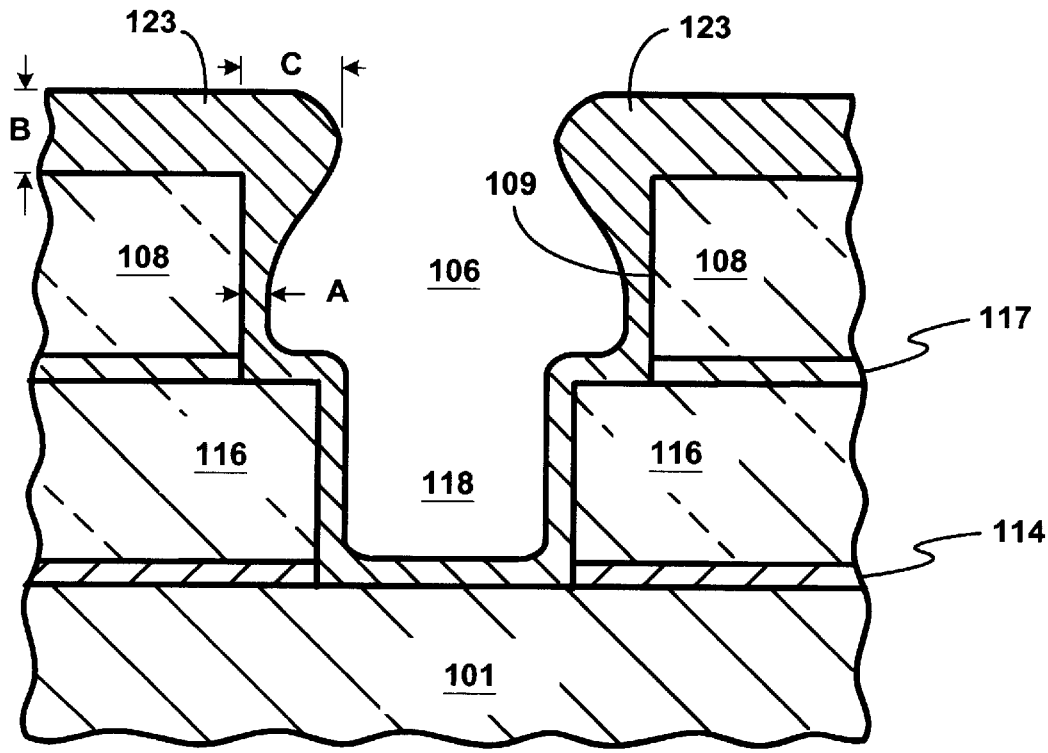
FIG. 1C (PRIOR ART) is a simplified cross-section of FIG. 1A (PRIOR ART) along line 1B—1B immediately after the deposition of barrier material in the second channel opening.

Referring now to FIG. 1C (PRIOR ART), therein is shown a close-up cross section of the semiconductor wafer 100 along 1B—1B immediately after the deposition of the barrier layer 123 and prior to the filling of the second channel opening 106 and via opening 118 with the second conductive material. As explained in the Background Art, the common problems associated with most PVD techniques and their derivatives are poor sidewall step coverage and conformality, i.e., the barrier layer thickness is much higher in wide-open areas, such as on top of the second channel oxide layer 108 and in the upper portion of the sidewalls 109 of the second channel opening 106. The sidewall step coverage and conformality are defined as follows:

Sidewall step coverage=$A/B$

Conformality=$A/C$ where A is the thickness of the thinnest area of the barrier layer 123 along the sidewalls 109, B is the thickness of the barrier layer 123 on top of the second channel oxide layer 108, and C is the thickness of the thickest area of the barrier layer 123 along the sidewalls 109. It is desirable to have high values in sidewall step coverage and conformality. In this case, since A is much smaller than either B or C, the sidewall step coverage and conformality would be low, indicating poor sidewall step coverage and conformality.

To guarantee a minimum barrier layer thickness of 5 nm anywhere in the channel opening 106, including at the lower portion of the sidewalls 109, the barrier layer thickness in the wide-open areas tends to be much higher than 5 nm. The increase in barrier layer thickness in the wide-open areas undesirably increases the electrical resistance of the barrier layer 123. Further, as the width of the channels and vias have decreased in size due to the size reduction in the semiconductor devices, an excessively thick barrier layer in the upper portion of the sidewalls of the second channel opening 102 would interfere with the subsequent filling of the second channel opening 106 and via opening 118 with the second conductive material.

The present invention provides a method for forming barrier layers in channel or via openings that result in a reduction in the electrical resistance of the barrier layers without a decrease in its barrier effectiveness, and an improvement in the subsequent filling of the channel or via openings by conductive materials.

Figure 2:
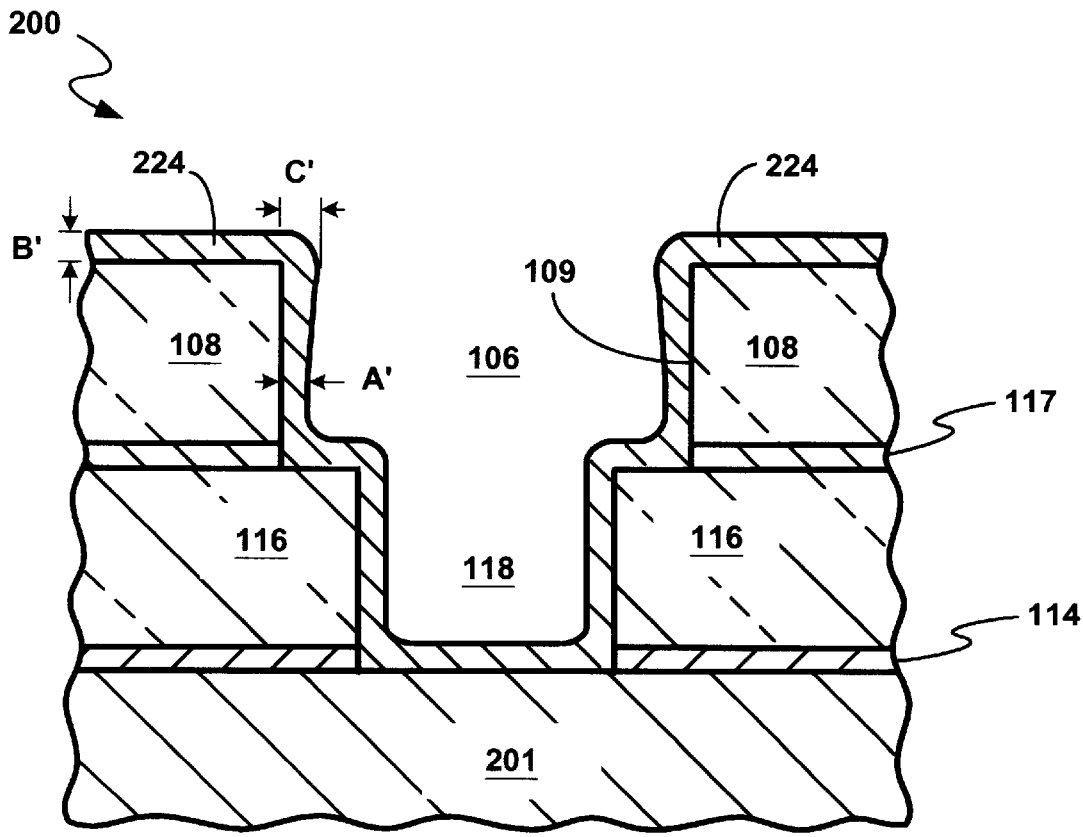
FIG. 2 is a simplified cross-section of a semiconductor wafer formed in accordance the present invention

Referring now to FIG. 2, therein is shown the cross-section of a semiconductor wafer 200 with a pair of aligned semiconductor channels, disposed over a silicon substrate 110 formed in accordance with the present invention. For convenience of illustration, like reference numerals are used in FIG. 2 to denote like elements already described in FIG. 1A (PRIOR ART) through FIG. 1C (PRIOR ART).

At this stage a barrier layer 224 is shown formed in the second channel opening 106 after a partial etch back using plasma etching but prior to the filling of second channel opening 106 and via opening 118 with the second conductive material. The plasma etching is an isotropic etching, removes more barrier material from the wide-open areas, such as on top of the second channel oxide layer 108 and in the upper portion of the sidewalls 109 of the second channel opening 106, and results in a thinner barrier layer around the wide-open areas and more even coverage on the sidewalls 109. Specifically, the thickness of the barrier layer 224 on top of the second channel oxide layer 108 (B') and the thickness of the thickest area of the barrier layer 224 along sidewalls 109 (C') have reduced significantly due the etch back, while the thickness of the thinnest area of the barrier layer 224 along the sidewalls 109 (A') has not changed much. Accordingly, both the sidewall step coverage (A'/B') and conformality (A'/C') have increased.

Further, a thinner barrier layer 224 would minimize its electrical resistance. In addition, since the etch back step mainly removes excessive barrier layer thickness around the wide-open areas, the thickness barrier layer 224 in the lower portion of the sidewall is generally not much affected. Therefore, the barrier effectiveness of the barrier layer 224 around the second channel opening 102 is not adversely impacted. Finally, as the excessive barrier layer thickness is removed from around the upper portion of the sidewalls 109, it allows proper filling of the second channel opening 102 with the second conductive material subsequently. Therefore, in accordance with the present invention, barrier layers with reduced electrical resistance can be formed in channel or via openings. The barrier layers so formed maintain its barrier effectiveness and enhance the subsequent filling of the channel or via openings by conductive materials.

In production, a conventional first damascene process was used to put down over a production semiconductor wafer 200 a first channel 201 in a first channel oxide layer (not shown) above portions of a semiconductor device (not shown). The damascene process is a photolithographic process which uses a mask to define a first channel opening (not shown) in the first channel oxide layer. The barrier layer is deposited according to the present invention and then covered by the seed layer. The first channel opening is then filled with a first conductive material, such as copper, to form the first channel 201 using conventional metal deposition technique, such as physical vapor deposition, chemical vapor deposition, electroplating, or a combination thereof. The stop nitride layer 114, the via oxide layer 116, and the via nitride layer 117 would be successively deposited on top of the first channel 201 and the first channel oxide layer using conventional deposition technique.

By using the via photoresist and the via photolithographic process followed by nitride etching of a round via opening 104 in the via nitride layer 117, the basis for the cylindrical via 118 was formed. The subsequent deposition of the second channel oxide layer 108 prepared the way for the second channel 106 to be perpendicular to the first channel 201.

The second damascene process is a photolithographic process which uses a mask to define the second channel opening 106 in the second channel oxide layer 108. Since the second damascene process uses an anisotropic oxide etch, the etch also forms the cylindrical via opening 118 down to the stop nitride layer 114. The anisotropic oxide etch etches faster in the vertical direction of FIG. 2 than in the horizontal direction. The nitride etch of the stop nitride layer 114 exposes a portion of the first channel 201 and completes the etching steps.

Next, a thin adhesion layer (not shown) may be deposited in the second channel opening 106 and the cylindrical via opening 118, including along the walls of the second channel opening 106 and the cylindrical via opening 118. The thickness of the adhesion material is insufficient to fill the second channel opening 106 and the cylindrical via opening 118. Examples of suitable adhesion materials include refractory metals such as titanium and tantalum. The adhesion layer is deposited using conventional deposition techniques, such as physical vapor deposition, chemical vapor deposition, or a combination thereof.

Thereafter, a thin barrier layer 224 is deposited on the adhesion layer in the second channel opening 106 and the cylindrical via opening 118. Again, the thickness of the barrier layer 224 is sufficient to fill the second channel opening 106 and the cylindrical via opening 118. Examples of suitable barrier materials include titanium nitride, tantalum, tantalum nitride, or tungsten nitride. The barrier layer 224 is deposited using conventional deposition techniques, such as physical vapor deposition, chemical vapor deposition, or a combination thereof.

The deposition of the barrier layer 224 is followed by an etch back process using conventional dry plasma etching techniques in accordance with the present invention. The plasma etching process is primarily an anisotropic etching process that would etch away excessive barrier layer material in the wide-open areas around the second channel opening 106. This plasma etching process will not etch much of barrier layer 224 around the lower portion of the sidewalls 109. The plasma etching parameters such as the gas pressure and RF power can be adjusted to optimize the etching process so that the excessive barrier layer thickness in the wide-open areas around the second channel opening 106 are removed while the thickness of the resultant barrier layer anywhere in the second channel opening 106 still meets the minimum barrier layer thickness requirement.

Next, the second conductive material is deposited into second channel opening 106 and via opening 118 using conventional metal deposition technique, such as physical vapor deposition, chemical vapor deposition, electroplating, or a combination thereof. Thereafter, a chemical mechanical polishing process is used to complete the conventional connection process similar to what were shown and described in FIGS. 1A and 1B.

Accordingly, by using a plasma etching technique to etch back the barrier layer, the present invention forms barrier layers in channel openings or via openings with reduced electrical resistance while maintains the barrier effectiveness of the barrier layer and enhances the proper filling of the channel openings or via openings by conductive materials.

While the best mode utilizes copper as the conductive material, it should be understood that the present invention is applicable to other conductive materials such as aluminum, tungsten, doped polysilicon, copper-base alloys, gold, gold-base alloys, silver, and silver-base alloys.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention. In addition, while the embodiments of the present inventions form a barrier layer in a channel opening and a via opening atop another conductive channel (201 as shown in FIG. 2), it should be understood that the present invention is applicable to forming a barrier layer in a channel opening and/or a via opening atop a conductive or a doped region formed on a semiconductor substrate.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor device, comprising the steps of:
   providing a semiconductor substrate with a dielectric layer formed thereon, wherein said dielectric layer overlays a region on said semiconductor substrate;
   forming an opening in said dielectric layer, said opening defined by walls of said dielectric layer and exposes a portion of said region on said semiconductor substrate;
   forming a barrier layer over said dielectric layer and in said opening, including along said walls, said barrier layer formed to a thickness insufficient to fill said opening;
   isotropically etching said barrier layer to reduce its thickness at least on top of said dielectric layer and around an upper portion of said walls; and
   forming a layer of conductive material in contact with said barrier layer, said conductive material layer substantially fills said opening.

2. The method as claimed in claim 1 wherein the step of isotropically etching said barrier layer is done by plasma etching.

3. The method as claimed in claim 1 wherein the step of isotropically etching said barrier layer increases sidewall step coverage and conformality of said barrier layer, sidewall step coverage is defined to be A/B and conformality is defined to be A/C, where A is the thickness of the thinnest area of said barrier layer along said walls, B is the thickness of said barrier layer on said dielectric layer, and C is the thickness of the thickest area of said barrier layer along said walls.

4. The method as claimed in claim 1 further including the step of:
   forming an adhesion layer on said dielectric layer and in said opening, including along said walls, in contact with said region of said semiconductor substrate to bond said barrier layer thereto; wherein the step of forming said adhesion layer is done by a process selected from a group consisting of physical vapor deposition, chemical vapor deposition, and a combination thereof.

5. The method as claimed in claim 1 further including the step of:
   forming an adhesion layer on said dielectric layer and in said opening, including along said walls, in contact with said region of said semiconductor substrate to bond said barrier layer thereto, wherein said adhesion layer comprises a material selected from a group consisting of titanium and tantalum.

6. The method as claimed in claim 1 wherein the step of forming said barrier layer is done by a process selected from a group comprising physical vapor deposition, chemical vapor deposition, and a combination thereof.

7. The method as claimed in claim 1 wherein said step of forming said barrier layer is done with a material selected from a group comprising titanium nitride, tantalum, tantalum nitride, and tungsten nitride.

8. The method as claimed in claim 1 wherein the step of forming said layer of conductive material is done by a process selected from a group comprising physical vapor deposition, chemical vapor deposition, electroplating, and a combination thereof.

9. The method as claimed in claim 1 wherein said step of forming said layer of conductive material is done with a material selected from a group comprising aluminum, tungsten, doped polysilicon, copper, gold and silver.

10. The method as claimed in claim 1, wherein said region is a conductive channel formed on said semiconductor substrate.

11. The method as claimed in claim 1 wherein said region is a doped region formed on said semiconductor substrate.

12. A method of manufacturing a semiconductor device, comprising the steps of:
   providing a semiconductor substrate with a dielectric layer formed thereon, wherein said dielectric layer overlays a region on said semiconductor substrate;
   forming an opening in said dielectric layer, said opening defined by walls of said dielectric layer and exposes a portion of said region on said semiconductor substrate;
   forming an adhesion layer on said dielectric layer and in said opening, including along said walls, in contact with said region of said semiconductor substrate, said adhesion layer formed to a thickness insufficient to fill said opening, wherein the step of forming said adhesion layer is done by physical vapor deposition, chemical vapor deposition, or a combination thereof;
   forming a barrier layer in contact with said adhesion layer, said barrier layer formed to a thickness insufficient to fill said opening, wherein the step of forming said barrier layer is done by physical vapor deposition, chemical vapor deposition, or a combination thereof;
   isotropically etching said barrier layer using plasma etching to reduce its thickness at least on top of said dielectric layer and around an upper portion of said walls, wherein the step of etching increases sidewall step coverage and conformality of said barrier layer, sidewall step coverage is defined to be A/B and conformality is defined to be A/C, where A is the thickness of the thinnest area of said barrier layer along said walls, B is the thickness of said barrier layer on said dielectric layer, and C is the thickness of the thickest area of said barrier layer along said walls; and
   forming a layer of conductive material in contact with said barrier layer, said conductive material layer substantially fills said opening, wherein the step of forming said layer of conductive material is done by a process selected from a group comprising physical vapor deposition, chemical vapor deposition, electroplating, and a combination thereof.

13. The method as claimed in claim 12 wherein said step of forming said adhesion layer is done with a material selected from a group comprising titanium and tantalum.

14. The method as claimed in claim 12 wherein said step of forming said barrier layer is done with a material selected from a group comprising titanium nitride, tantalum, tantalum nitride, and tungsten nitride.

15. The method as claimed in claim 12 wherein said step of forming said layer of conductive material is done with a material selected from a group comprising aluminum, tungsten, doped polysilicon, copper, gold and silver.

16. The method as claimed in claim 12, wherein said region is a conductive channel formed on said semiconductor substrate.

17. The method as claimed in claim 12, wherein said region is a doped region formed on said semiconductor substrate.

18. A method of manufacturing a semiconductor device, comprising the steps of:

providing a semiconductor substrate with a dielectric layer formed thereon, wherein said dielectric layer overlays a region on said semiconductor substrate;

forming an opening in said dielectric layer, said opening defined by walls of said dielectric layer and exposes a portion of said region on said semiconductor substrate;

forming an adhesion layer comprising a material selected from the group consisting of titanium and tantalum on said dielectric layer and in said opening, including along said walls, in contact with said region of said semiconductor substrate, said adhesion layer formed to a thickness insufficient to fill said opening, wherein the step of forming said adhesion layer is done by a process selected from a group comprising physical vapor deposition, chemical vapor deposition, and a combination thereof;

forming a barrier layer comprising a material selected from the group consisting of titanium nitride, tantalum, tantalum nitride, and tungsten nitride in contact with said adhesion layer, said barrier layer formed to a thickness insufficient to fill said opening, wherein the step of forming said barrier layer is done by physical vapor deposition, chemical vapor deposition, or a combination thereof;

isotropically etching said barrier layer using plasma etching to reduce its thickness at least on top of said dielectric layer and around an upper portion of said walls, wherein the step of etching increases sidewall step coverage and conformality of said barrier layer, sidewall step coverage is defined to be A/B and conformality is defined to be A/C, where A is the thickness of the thinnest area of said barrier layer along said walls, B is the thickness of said barrier layer on said dielectric layer, and C is the thickness of the thickest area of said barrier layer along said walls; and forming a layer of conductive material in contact with said barrier layer, wherein said conductive material is selected from a group comprising aluminum, tungsten, doped polysilicon, copper, gold and silver, said conductive material layer substantially fills said opening, and the step of forming said layer of conductive material is done by a process selected from a group comprising physical vapor deposition, chemical vapor deposition, electroplating, and a combination thereof.

19. The method as claimed in claim 18, wherein said region is a conductive channel formed on said semiconductor substrate.

20. The method as claimed in claim 18, wherein said region is a doped region formed on said semiconductor substrate.

* * * * *